(12) United States Patent
Liang (10) Patent No.: US 11,437,482 B2
(45) Date of Patent: Sep. 6, 2022

(54) FIELD EFFECT TRANSISTOR, METHOD OF FABRICATING FIELD EFFECT TRANSISTOR, AND ELECTRONIC DEVICE

(71) Applicants: BEIJING HUA TAN YUAN XIN ELECTRONICS TECHNOLOGY CO., LTD, Beijing (CN); BEIJING HUATAN TECHNOLOGY CO., LTD., Beijing (CN)

(72) Inventor: Shibo Liang, Beijing (CN)

(73) Assignees: BEIJING HUA TAN YUAN XIN ELECTRONICS TECHNOLOGY CO., LTD, Beijing (CN); BEIJING HUATAN TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/772,734

(22) PCT Filed: Oct. 17, 2018

(86) PCT No.: PCT/CN2018/110626
§ 371 (c)(1),
(2) Date: Jun. 12, 2020

(87) PCT Pub. No.: WO2019/114407
PCT Pub. Date: Jun. 20, 2019

(65) Prior Publication Data
US 2020/0328283 A1   Oct. 15, 2020

(30) Foreign Application Priority Data

Dec. 14, 2017 (CN) .......................... 201711337894.3

(51) Int. Cl.
*H01L 21/00* (2006.01)
*H01L 29/423* (2006.01)
(Continued)

(52) U.S. Cl.
CPC .. *H01L 29/42364* (2013.01); *H01L 21/02527* (2013.01); *H01L 21/823412* (2013.01);
(Continued)

(58) Field of Classification Search
CPC ......... H01L 29/42364; H01L 21/02527; H01L 21/823412; H01L 29/0669; H01L 29/167; H01L 29/66045
See application file for complete search history.

(56) References Cited

U.S. PATENT DOCUMENTS 10,109,477 B2   10/2018  Fan et al.
2009/0294759 A1*  12/2009  Woo .................. H01L 21/02433
257/29

(Continued)

FOREIGN PATENT DOCUMENTS

CN       101783366 A     7/2010
CN       106169511 A    11/2016
(Continued)

OTHER PUBLICATIONS

International Search Report and Written Opinion of the International Searching Authority (in English) issued in PCT/CN2018/110626, dated Jan. 4, 2019; ISA/CN.
(Continued)

*Primary Examiner* — Richard A Booth
(74) *Attorney, Agent, or Firm* — Harness, Dickey & Pierce, P.L.C.

(57) ABSTRACT

A field effect transistor (FET), a method of fabricating the field effect transistor, and an electronic device are provided. The field effect transistor comprises: a source and a drain, the source being made of a Dirac material (103); a channel disposed between the source and the drain, and doped opposite to the source; and a gate (106) disposed on the channel and electrically insulated from the channel.

19 Claims, 9 Drawing Sheets

(51) Int. Cl.
*H01L 21/02* (2006.01)
*H01L 21/8234* (2006.01)
*H01L 29/06* (2006.01)
*H01L 29/167* (2006.01)
*H01L 29/66* (2006.01)

(52) U.S. Cl.
CPC .. *H01L 21/823462* (2013.01); *H01L 29/0669* (2013.01); *H01L 29/167* (2013.01); *H01L 29/66045* (2013.01)

(56) References Cited

U.S. PATENT DOCUMENTS

| | | | | |
|---|---|---|---|---|
| 2011/0121409 | A1* | 5/2011 | Seo | H01L 21/3146 257/410 |
| 2012/0080658 | A1* | 4/2012 | Yang | H01L 29/66477 257/9 |
| 2015/0280012 | A1* | 10/2015 | Sato | H01L 29/1606 257/29 |
| 2016/0343891 | A1 | 11/2016 | Heo et al. | |
| 2017/0338311 | A1 | 11/2017 | Lee et al. | |

FOREIGN PATENT DOCUMENTS

| | | |
|---|---|---|
| CN | 106356405 A | 1/2017 |
| CN | 107039280 A | 8/2017 |
| CN | 108091698 A | 5/2018 |
| WO | WO-2019114407 A1 | 6/2019 |

OTHER PUBLICATIONS

First Office Action issued in Chinese Application No. 201711337894.3, dated Mar. 3, 2020 (with English translation).
Bronner, "Bottom-Up Synthesis and Electronic Structure of Graphene Nanoribbons on Surfaces", Encyclopedia of Interfacial Chemistry, 2018, pp. 210-225.
Wehling et al., "Dirac Materials", Advances in Physics, vol. 63 Issue 1, Jul. 23, 2014, pp. 1-76.

* cited by examiner

FIELD EFFECT TRANSISTOR, METHOD OF FABRICATING FIELD EFFECT TRANSISTOR, AND ELECTRONIC DEVICE

CROSS-REFERENCE TO RELATED APPLICATIONS

This application is a U.S. National Phase application based upon PCT Application No. PCT/CN2018/110626, filed on Oct. 17, 2018, which claims the priority of Chinese Patent Application No. 201711337894.3, filed on Dec. 14, 2017, and the disclosures of which are hereby incorporated by reference.

FIELD

The present application relates to the field of a semiconductor device, and specifically a field effect transistor (FET), a method of fabricating a field effect transistor, and an electronic device.

BACKGROUND

A metal-oxide-semiconductor field effect transistor (MOS FET) is a basic component for building an integrated circuit. Switch state transition of a MOS FET is realized by applying a voltage on the gate of the device to control a source-drain current thereof. A turn-off speed is described by a subthreshold swing (SS), wherein the subthreshold swing is a gate voltage increment that needs to be applied to vary the source-drain current by one order of magnitude. The smaller the subthreshold swing is, the faster the transistor turns off. Due to limitations of the thermal excitation mechanism, the theoretical minimum value of the subthreshold swing of a conventional FET at room temperature is 60 mV/Dec. Further developments of integrated circuits require that the operating voltage continues to decrease, while the thermal excitation limit of 60 mV/Dec for the subthreshold swing in MOS FETs limits the operating voltage of integrated circuits to less than 0.64 V, limiting a further reduction of power consumption of the integrated circuits. Therefore, to further promote developments of complementary metal oxide semiconductor (CMOS) technology, and to realize integrated circuits of ultra-low power consumption, it is necessary to break the limit on the sub-threshold swing by the thermal excitation mechanism of conventional MOSFETs to implement transistors having a subthreshold swing of less than 60 mV/Dec.

Currently, there are mainly two types of transistors that can realize subthreshold swings of less than 60 mV/Dec: one type is tunnel transistor (Tunnel FET), and the other is negative-capacitance transistor. A heavily doped n-p tunneling junction is formed in the channel of the tunnel transistor, carriers only can be transported from a source to a drain by inter-band tunneling, and tunneling current is controlled by adjusting the thickness of the tunneling junction by the gate voltage, thereby realizing a switch state transition of the transistor. When the tunnel transistor is turned off, the physical limit of the thermal excitation on the turn-off speed in conventional FET devices is eliminated, realizing a subthreshold swing of less than 60 mV/Dec at room temperature. However, presence of the tunneling junction also greatly reduces the drive current of the tunnel transistor. The maximum on-state current of the tunnel transistor currently realized is less than 1% of that of a normal transistor. Specifically, the maximum current of the tunnel transistor with a subthreshold swing of less than 60 mV/Dec at room temperature is 1-10 nA/μm, which does not meet the requirements of the International Technology Roadmap for Semiconductors (ITRS). Under this circumstance, the operating speeds of the device and the circuit are greatly reduced, thereby failing to meet the working needs of a normal integrated circuit. Thus such a tunnel transistor has no practical value. Negative-capacitance transistors generally use ferroelectric materials as the gate capacitance, which can realize a subthreshold swing of less than 60 mV/Dec and a high drive current at the same time, but negative-capacitance transistors have problems of a slow speed, a poor stability, and unsuitability for integration.

BRIEF SUMMARY

According to a first aspect of the present disclosure, a field effect transistor is provided, comprising: a source and a drain, the source being made of a Dirac material; a channel disposed between the source and the drain, and doped opposite to the source; and a gate disposed on the channel, and electrically insulated from the channel.

According to at least one embodiment of the present disclosure, the Dirac material comprises graphene, a Weyl semi-metal, a d-wave superconductor or a topological insulator.

According to at least one embodiment of the present disclosure, the source is in electrical contact with the channel.

According to at least one embodiment of the present disclosure, the contact barrier height between the source and the channel is less than 0.2 eV. According to at least one embodiment of the present disclosure, the source is n-doped and the channel is p-doped; or the source is p-doped and the channel is n-doped.

According to at least one embodiment of the present disclosure, the field effect transistor further comprises a gate insulating layer formed on the channel and having an equivalent oxide thickness of less than 2 nm.

According to at least one embodiment of the present disclosure, the drain and the channel are formed of the same layer of material.

According to at least one embodiment of the present disclosure, the drain is formed of a Dirac material or a metal material.

According to at least one embodiment of the present disclosure, the channel is formed by at least one of: a carbon nanotube, a semiconductor nanowire, a two-dimensional semiconductor material, and a three-dimensional semiconductor material.

According to a second aspect of the present disclosure, a method of fabricating a field effect transistor is provided, comprising: forming a channel on a substrate; and forming a source and a drain on the substrate, such that the channel is disposed between the source and the drain, wherein the source is formed of a Dirac material and is doped opposite to the channel.

According to at least one embodiment of the present disclosure, the Dirac material comprises: graphene, a Weyl semi-metal, a d-wave superconductor or a topological insulator.

According to at least one embodiment of the present disclosure, the step of forming a source and a drain on a substrate further comprises electrically contacting the source with the channel.

According to at least one embodiment of the present disclosure, the contact barrier height between the source and the channel is less than 0.2 eV.

According to at least one embodiment of the present disclosure, the source is n-doped and the channel is p-doped; or the source is p-doped and the channel is n-doped.

According to at least one embodiment of the present disclosure, the method further comprises: forming a gate insulating layer on the channel, wherein the gate insulating layer has an equivalent oxide thickness of less than 2 nm.

According to at least one embodiment of the present disclosure, the drain and the channel are formed of the same layer of material.

According to at least one embodiment of the present disclosure, the drain is formed of a Dirac material or a metal material.

According to at least one embodiment of the present disclosure, the channel is formed by at least one of: a carbon nanotube, a semiconductor nanowire, a two-dimensional semiconductor material, and a three-dimensional semiconductor material.

According to a third aspect of the present disclosure, an electronic device comprising a field effect transistor is provided, comprising: a source and a drain, the source being made of a Dirac material; a channel disposed between the source and the drain, and doped opposite to the source; and a gate disposed on the channel, and electrically insulated from the channel.

BRIEF DESCRIPTION OF THE DRAWINGS

The figures illustrate exemplary embodiments of the present disclosure, and, together with their depictions, are used to explain the principles of the present disclosure. The figures, which are included and constitute part of the Description are provided to provide a further understanding of the present disclosure.

DETAILED DESCRIPTION

The present disclosure will be further described in detail below in conjunction with the Drawings and embodiments. It is to be understood that the specific embodiments described herein are only for the purpose of illustration, instead of limiting the present disclosure. It is to be noted that, for the convenience of depictions, only parts related to the present disclosure are shown in the drawings.

It is also to be noted that under the circumstance of no conflicts, the features in the embodiments and the embodiments in the present disclosure may be combined with each other. The present disclosure will be described in detail below with reference to the Drawings and embodiments.

Figure 1:
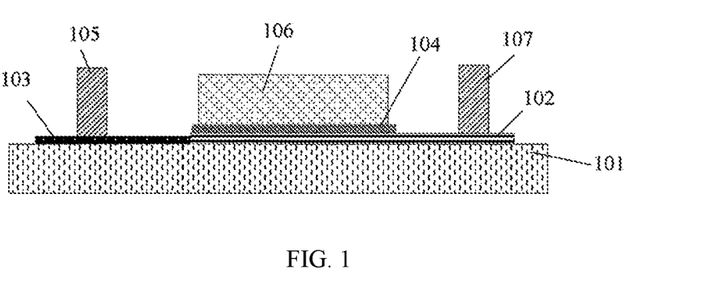
FIG. 1 exemplarily shows a schematic structural view of a field effect transistor according to an embodiment of the present disclosure.

FIG. 1 shows a schematic structural view of a field effect transistor according to an embodiment of the present disclosure. As shown in FIG. 1, a field effect transistor according to an embodiment of the present disclosure may be formed on a substrate 101. The rigidity of the substrate 101 is sufficient to provide support for the device during fabricating operations. The substrate 101 can be an amorphous or crystalline material. By way of example, the substrate 101 can be glass, sapphire, silicon, polymer, silicon-on-insulator, or any other substrate on which an insulating layer can be deposited. Embodiments of the present disclosure are not limited to the above-described substrates, because the semiconductor properties of field effect transistors according to embodiments of the present disclosure are not dependent on semiconductor characteristics of these substrates.

A material 102 for forming a channel may be disposed on the substrate 101. The material 102 has electrical properties of a semiconductor. For example, the materials 102 may include carbon nanotubes, semiconductor nanowires, two-dimensional semiconductor materials (such as black phosphorus, and molybdenum disulfide), or three-dimensional semiconductor materials (such as silicon). However, the present disclosure is not limited thereto. Furthermore, for electronic transistors, the material 102 is n-doped such that material 102 has such electrical properties as an n-type semiconductor (e.g., electrons become primary carriers), and for hole-type transistors, the material 102 is p-doped such that the material 102 has such electrical properties as a p-type semiconductor (e.g., holes become primary carriers). The material 102 can be doped by, for example, a high temperature thermal diffusion technique or an ion implantation technique. The material 102 can be formed on the substrate 101 with chemical methods such as chemical vapor deposition or physical methods such as coating. Alternatively, the surface of the substrate 101 may also be doped to form the material 102. For example, when the substrate 101 is silicon-on-insulator, the silicon may be doped to form the material 102. In FIG. 1, material 102 is in direct contact with the substrate 101. However, those skilled in the art should appreciate that other layers or elements may be present between the material 102 and the substrate 101.

Also provided on the substrate 101 is a Dirac material 103 for forming a source. The Dirac material referred to herein means a material of which the low-energy electron excitation acts like a Dirac particle, i.e. a material of which the low-energy electron excitation can be described by the Dirac equation. The density of electronic states of the Dirac material 103 is a decreasing function of energy, and the electron density decreases super-exponentially as the energy increases. For example, the Dirac material 103 can include: graphene, a Weyl semi-metal, a d-wave superconductor, or a topological insulator. It will be understood by one of ordinary skilled in the art that only part of examples of the Dirac material 103 are given in the present disclosure, and that all materials that can be used as the Dirac material 103 are not exhaustive, and the present disclosure is not limited thereto. Additionally, as shown in FIG. 1, the Dirac material 103 is in electrical contact with the material 102. Although FIG. 1 shows that the Dirac material 103 is juxtaposed with and in contact with the material 102, the Dirac material 103 may also overlap with the material 102, which is not limited in this disclosure. For electronic transistors, the Dirac material 103 is p-doped, and for hole-type transistors, the Dirac material 103 is n-doped, i.e., the Dirac material 103 is doped opposite to the material 102. Similarly, the Dirac material 103 can be doped by, for example, a high temperature thermal diffusion technique or an ion implantation technique. In an embodiment of the present disclosure, the contact barrier height between the doped Dirac material 103 and the doped material 102 is less than 0.2 eV. In the embodiment shown in FIG. 1, the drain and the channel are formed of the same layer of material, i.e., the drain is also formed of the material 102. By forming the drain and the channel from the same layer of material, the method of fabricating a field effect transistor can be simplified, the cost can be reduced, and the fabricating time can be shortened.

A source 105 may be disposed on the Dirac material 103, and a drain 107 may be disposed on the material 102. The source 105 and the drain 107 are formed of a conductive material such as Al, or Pd. The source 105 and the drain 107 may be formed of the same material or may be formed of different materials. The source 105 and the drain 107 can be formed, for example, by processes such as thin film growth, photolithography, etching and the like.

A gate insulating layer 104 may be laminated with the material 102. For example, the gate insulating layer 104 may include $HfO_2$, $Y_2O_3$ or other insulating materials. The gate insulating layer 104 can be formed with a method such as atomic layer deposition. Although the gate insulating layer 104 is shown to cover only a portion of the material 102 in FIG. 1, those skilled in the art will appreciate that the gate insulating layer 104 may cover the entire surfaces of the Dirac material 103 and the material 102, or the gate insulating layer 104 may cover only the entire surface of the material 102 without covering the Dirac material 103. When the gate insulating layer 104 covers the Dirac material 103, the source 105 may be in contact with the Dirac material 103 through a via hole formed in the gate insulating layer 104. When the gate insulating layer 104 covers the entire surface of the material 102, the drain 107 may be in contact with the material 102 through a via hole formed in the gate insulating layer 104. In addition, the equivalent oxide thickness (EOT) of the gate insulating layer 104 may be less than 2 nm. The equivalent oxide thickness as referred to herein means the equivalent thickness of a thin layer of any dielectric material by regarding the dielectric material as silicon dioxide equivalently.

Figure 2:
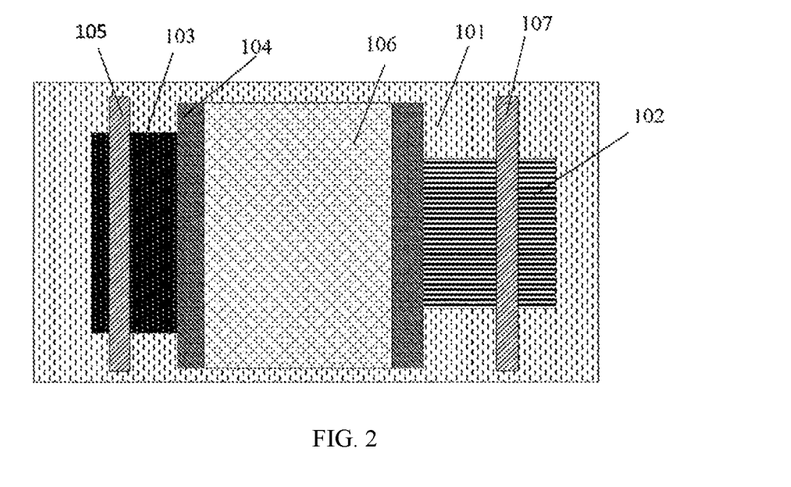
FIG. 2 exemplarily shows a top view of a field effect transistor according to an embodiment of the present disclosure.

A gate 106 may be disposed on the gate insulating layer 104 and electrically insulated from the material 102 by the gate insulating layer 104. The projection of the gate 106 on the material 102 at least partially coincides with the projection of the gate insulating layer 104 on the material 102. The projected area of the gate 106 on the material 102 can be less than or equal to the projected area of the gate insulating layer 104 on the material 102. For example, the projected area of the gate 106 on the material 102 is shown in FIG. 2 to be less than the projected area of the gate insulating layer 104 on the material 102. The gate 106 may be formed of a conductive material such as Al, or Pd. The gate 106, the source 105 and the drain 107 may be formed of the same or different material(s), and the present disclosure is not limited thereto. Similarly, the gate 106 can be formed, for example, by processes such as thin film growth, photolithography, etching and the like.

Figure 3:
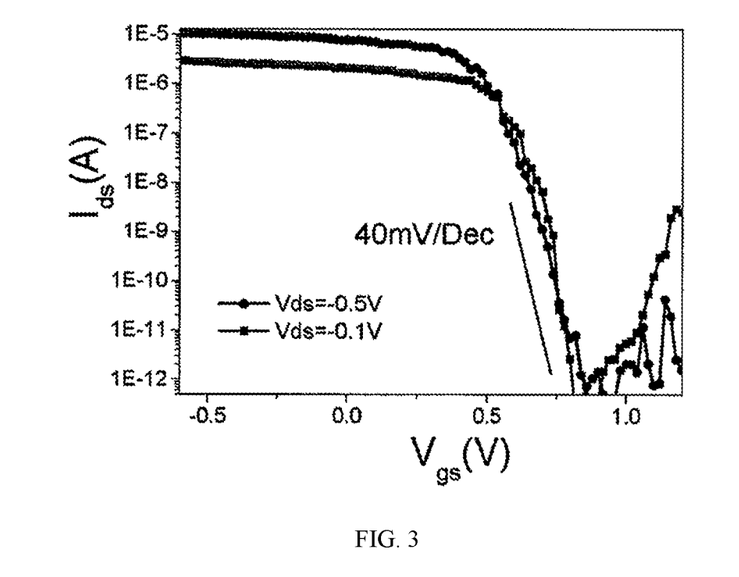
FIG. 3 exemplarily shows a transfer curve of an example of a field effect transistor according to an embodiment of the present disclosure.

FIG. 3 illustrates a transfer curve of an example of a field effect transistor in accordance with an embodiment of the present disclosure. Specifically, FIG. 3 illustrates a transfer curve at room temperature of an example of a field effect transistor according to a specific embodiment of the present disclosure, the transfer curve representing a relationship between a source-drain current $I_{ds}$ and a gate source voltage $V_{gs}$. The room temperature referred to herein means 300K. The field effect transistor in the present embodiment has a structure similar to that shown in FIG. 1. In the example of the field effect transistor according to the present embodiment, n-doped graphene is used as a source. In FIG. 3, it can be observed that in the present embodiment, in the case where the source-drain voltage is −0.5 V and −0.1 V, a subthreshold swing of less than 60 mV/Dec, specifically 40 mV/Dec, can be obtained. Thus, a field effect transistor in accordance with an embodiment of the present disclosure can realize a subthreshold swing that is less than the theoretical minimum value of a subthreshold swing of a conventional field effect transistor at room temperature (i.e., 60 mV/Dec). Moreover, those skilled in the art will appreciate that the above-described subthreshold swing of 40 mV/Dec is only a subthreshold swing realized by one example of a field effect transistor according to an embodiment of the present disclosure. However, the field effect transistor according to an embodiment of the present disclosure can also realize other subthreshold swings of less than 60 mV/Dec, such as about 50 mV/Dec, about 40 mV/Dec, and about 35 mV/Dec.

Figure 4:
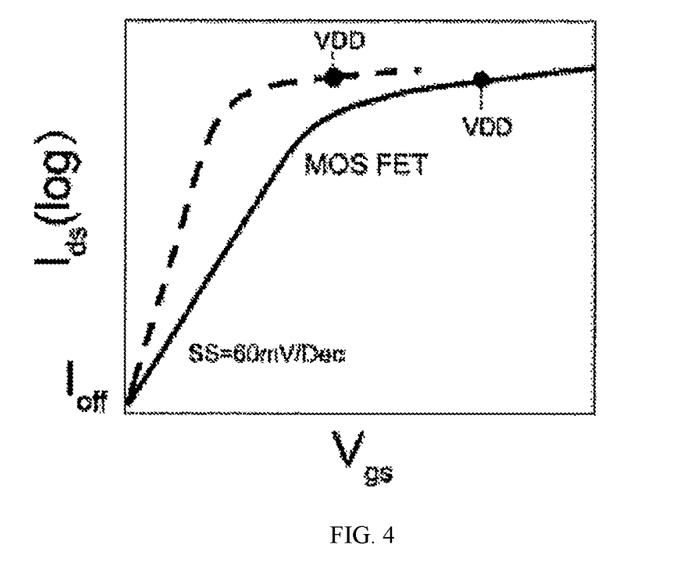
FIG. 4 exemplarily shows a comparison of transfer characteristics of a conventional field effect transistor with those of a field effect transistor according to an embodiment of the present disclosure.

FIG. 4 schematically shows a comparison of transfer characteristics of a conventional field effect transistor at room temperature with those of a field effect transistor according to an embodiment of the present disclosure. In FIG. 4, the solid line represents the transfer characteristic of a conventional field effect transistor having a subthreshold swing of 60 mV/Dec, and the dashed line represents the transfer characteristic of the field effect transistor according to an embodiment of the present disclosure. Since a field effect transistor according to an embodiment of the present disclosure can obtain a subthreshold swing of less than 60 mV/Dec, a field effect transistor according to an embodiment of the present disclosure can obtain a smaller operating voltage VDD with respect to a conventional field effect transistor, and an on-state current having a magnitude approximate to that of the on-state current of a conventional field effect transistor can be obtained. As an example, a field effect transistor according to an embodiment of the present disclosure may obtain an operating voltage of about 0.5 V, which is lower than an operating voltage of 0.7 V of a current 14 nm process Si MOS FET, and a field effect transistor according to an embodiment of the present disclosure can obtain an on-state current approximately equal to the on-state current of the current 14 nm process Si MOS FET at an operating voltage of 0.5V.

Compared with related arts, the field effect transistor according to an embodiment of the present disclosure can realize a subthreshold swing of less than 60 mV/Dec at room temperature, and can realize a smaller operating voltage, a similar on-state current and a smaller off-state current, reducing power consumption.

Figure 5:
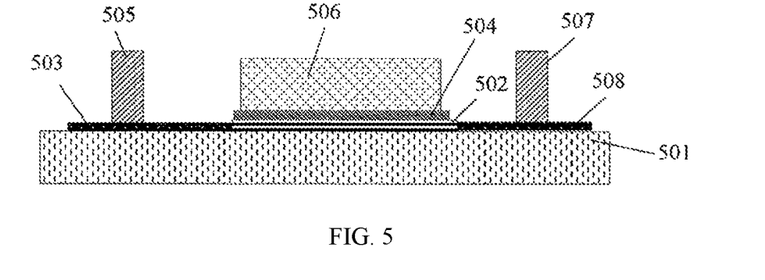
FIG. 5 exemplarily shows a schematic structural view of a field effect transistor according to an embodiment of the present disclosure.

FIG. 5 shows a schematic structural view of a field effect transistor according to an embodiment of the present disclosure. Substrate 501, material 502, Dirac material 503, gate insulating layer 504, source 505, gate 506, and drain 507 in FIG. 5 are the same as substrate 101, material 102, Dirac material 103, gate insulating layer 104, source 105, gate 106, and drain 107 in FIG. 1 respectively, and thus it will not be repeatedly described herein. In the present embodiment, the field effect transistor further includes a Dirac material 508 between the drain 507 and the substrate 501. The Dirac material 508 acts as a drain and is in electrical contact with the material 502. In the present embodiment, the Dirac material 508 is the same as the Dirac material 503. However, those skilled in the art will appreciate that the Dirac material 508 may also be different from the Dirac material 503, which is not limited in this disclosure.

Similarly, compared with related arts, a field effect transistor having the structure shown in FIG. 5 can realize a subthreshold swing of less than 60 mV/Dec at room temperature, and can realize a smaller operating voltage, a similar on-state current and a smaller off-state current, reducing power consumption.

Figure 6:
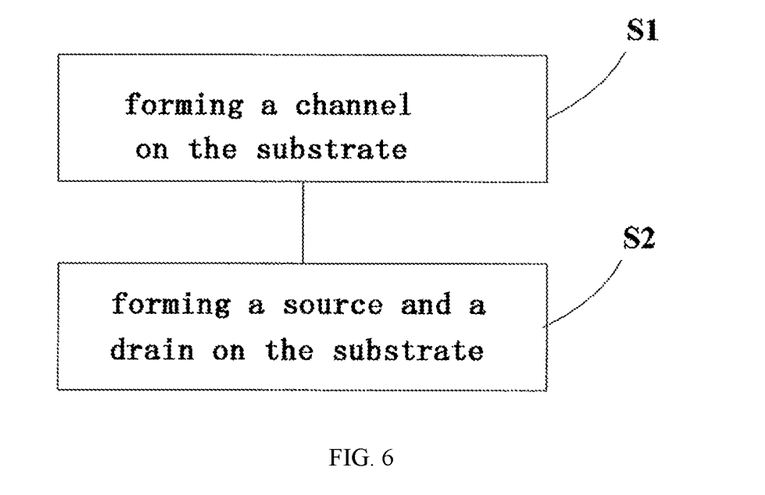
FIG. 6 shows a flow chart of a method of fabricating a field effect transistor according to an embodiment of the present disclosure.

FIG. 6 illustrates a flow chart of a method of fabricating a field effect transistor in accordance with an embodiment of the present disclosure. A method of fabricating a field effect transistor according to an embodiment of the present disclosure comprises:
S1: forming a channel on the substrate; and
S2: forming a source and a drain on the substrate such that the channel is disposed between the source and the drain, wherein the source is formed of a Dirac material and is doped opposite to the channel.

Figure 7:
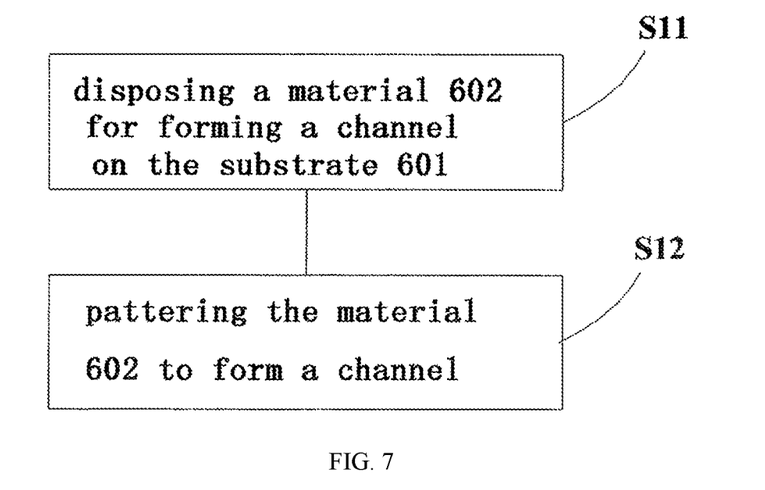
FIG. 7 exemplarily shows a flowchart of a step of forming a channel according to an embodiment of the present disclosure.

As shown in FIG. 7, in an embodiment of the present disclosure, the step of forming a channel on a substrate may include the following sub-steps:
S11: disposing a material 602 for forming a channel on the substrate 601; and
S12: patterning the material 602 to form a channel.

Figure 8A:
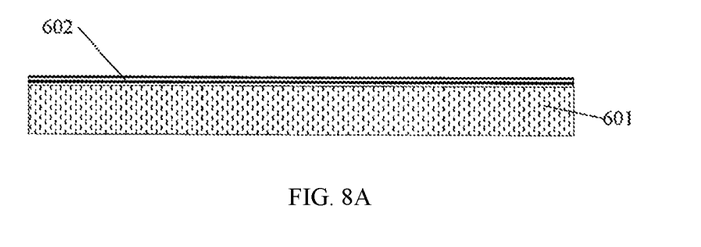
FIGS. 8A-8B exemplarily illustrate sub-steps of providing a material for forming a channel on a substrate according to an embodiment of the present disclosure.
Figure 8B:
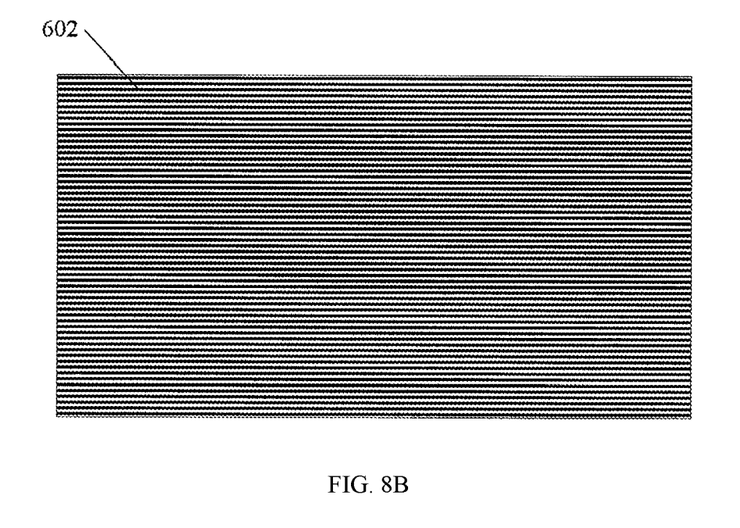
Figure 9A:
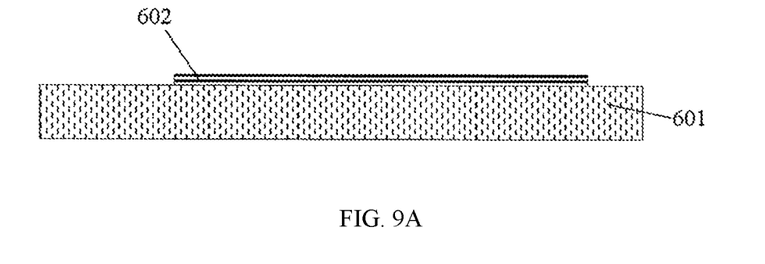
FIGS. 9A-9B exemplarily illustrate sub-steps of patterning a material to form a channel according to an embodiment of the present disclosure.
Figure 9B:
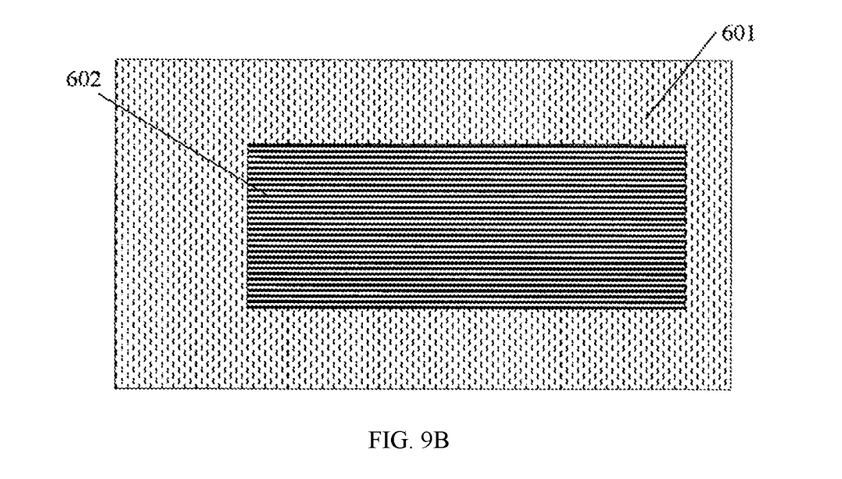

FIGS. 8A-8B exemplarily illustrate sub-steps of providing a material for forming a channel on the substrate. FIGS. 9A-9B exemplarily illustrate sub-steps of patterning a material to form a channel. The material 602 can be formed on the substrate 601 with chemical methods such as chemical vapor deposition or physical methods such as coating. The material 602 should have the electrical properties of a semiconductor. For example, the material 602 can include carbon nanotubes, semiconductor nanowires, two-dimensional semiconductor materials (such as black phosphorus, and molybdenum disulfide), or three-dimensional semiconductor materials (such as silicon). However, the disclosure is not limited thereto. In the present embodiment, the material 602 may be prepared in advance.

Alternatively, the step of forming a channel on the substrate can include doping the substrate 601 to form a material 602 for forming a channel. For example, when the substrate 601 is silicon-on-insulator, the silicon may be doped to form the material 602. The material 602 can be formed in direct contact with the substrate 601. However, those skilled in the art will appreciate that other layers or elements can be present between the material 602 and the substrate 601.

Figure 10:
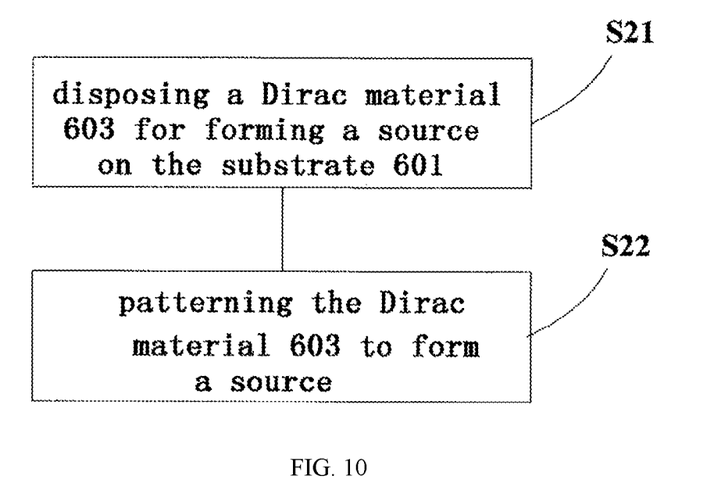
FIG. 10 illustrates a flow chart of steps of forming a source and a drain on a substrate according to an embodiment of the present disclosure.

As shown in FIG. 10, the step of forming a source and a drain on a substrate may include the following sub-steps:
S21: disposing a Dirac material 603 for forming a source on the substrate 601; and
S22: patterning the Dirac material 603 to form a source.

Figure 11A:
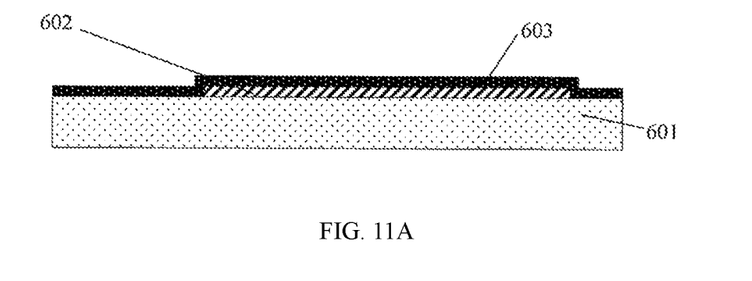
FIGS. 11A-11B exemplarily illustrate sub-steps of providing Dirac material for forming a source on a substrate according to an embodiment of the present disclosure.
Figure 11B:
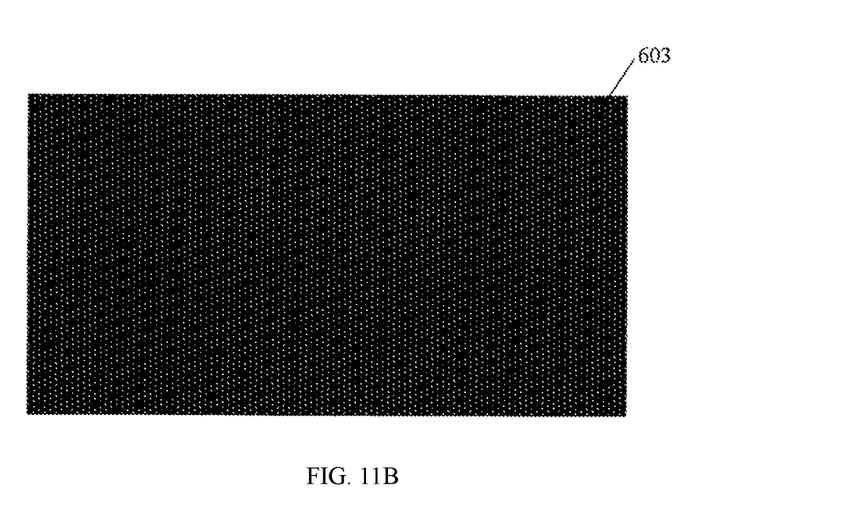
Figure 12A:
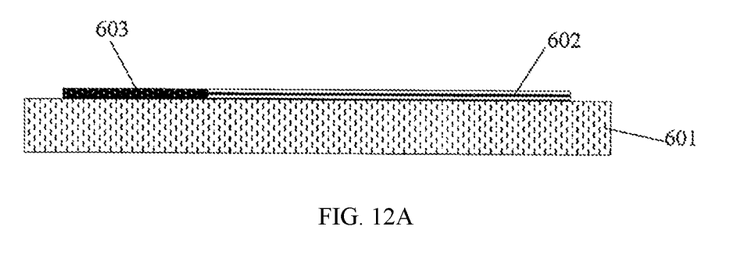
FIGS. 12A-12B exemplarily illustrate sub-steps of patterning the Dirac material to form a source according to an embodiment of the present disclosure.
Figure 12B:
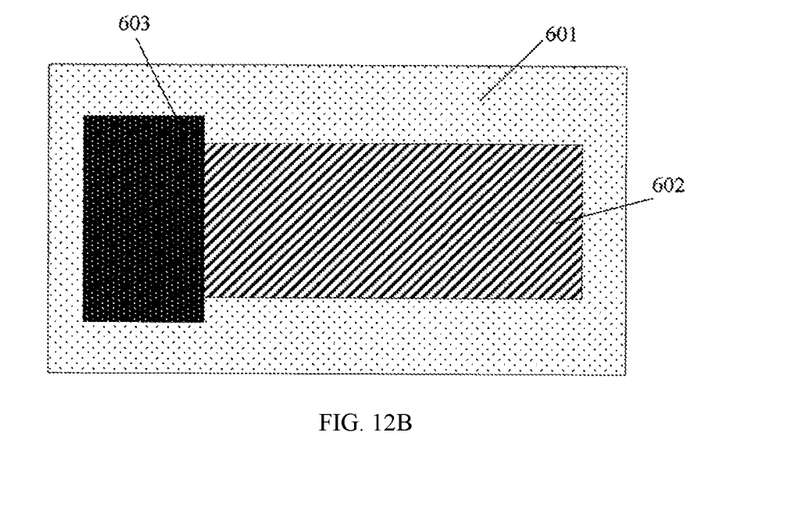

FIGS. 11A-11B exemplarily illustrate sub-steps of providing Dirac material for forming a source on a substrate. FIGS. 12A-12B exemplarily illustrate sub-steps of patterning the Dirac material to form a source. In step S22, the patterned Dirac material 603 is in electrical contact with the material 602. As described above, the Dirac material 603 is doped opposite to the material 602. In an embodiment of the present disclosure, the contact barrier height between the doped Dirac material 603 and the doped material 602 is less than 0.2 eV.

In the present embodiment, the drain and the channel are formed of the same layer of material, that is, the drain is also formed of the material 602. In the case where the drain and the channel are formed of the same layer of material, the drain and the channel can be formed in the same step. By forming the drain and the channel from the same layer of material, the method of fabricating the field effect transistor can be simplified, the cost can be reduced, and the fabricating time can be shortened. However, it will be understood by those skilled in the art that the drain formed of the Dirac material can also be formed by steps similar to sub-steps S21 and S22, with the drain and source being formed on both sides of the channel. For example, another layer of Dirac material can be placed over the substrate 601 and the layer of Dirac material can be patterned to form a drain. Those skilled in the art will appreciate that the source and the drain may be formed of the same Dirac material or may be formed of different Dirac materials, and the disclosure is not limited thereto. For example, both the source and the drain can be formed of graphene. In the case where the drain and source are formed of the same Dirac material, the drain may also be formed by the Dirac material 603 in sub-step S22.

Figure 13A:
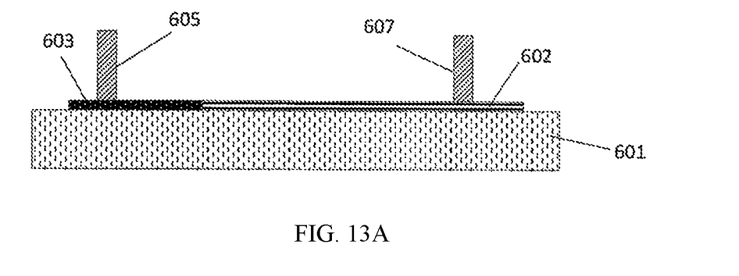
FIGS. 13A-13B exemplarily illustrate steps of forming a source and a drain according to an embodiment of the present disclosure.
Figure 13B:
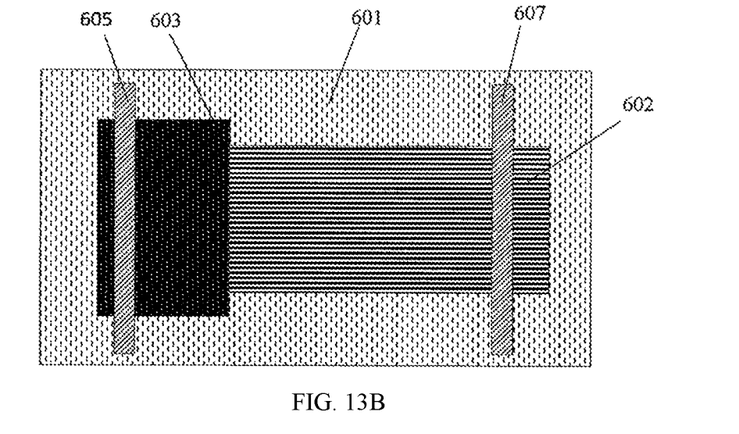

According to an embodiment of the present disclosure, the method may further include forming a source and a drain. FIGS. 13A-13B exemplarily illustrate the steps of forming the source 605 and the drain 607. These steps can be carried out, for example, by processes such as film growth, photolithography, etching and the like.

Figure 14A:
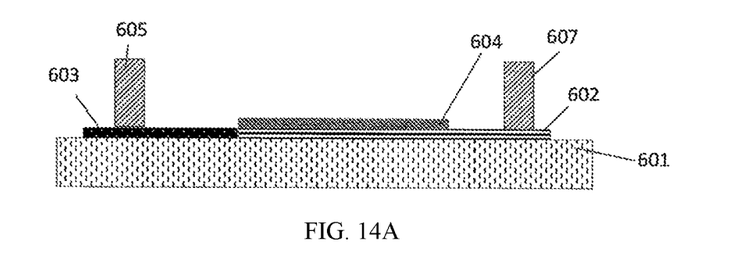
FIGS. 14A-14B exemplarily illustrate steps of forming a gate insulating layer according to an embodiment of the present disclosure.
Figure 14B:
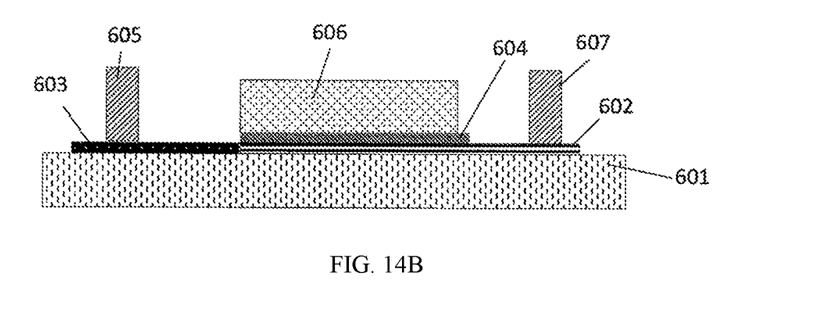

According to an embodiment of the present disclosure, the method may further include forming a gate insulating layer. FIGS. 14A-14B exemplarily illustrate the steps of forming a gate insulating layer 604. This step can be carried out, for example, with a method such as atomic layer deposition. Although the gate insulating layer 604 only covers a portion of the material 602 in FIGS. 14A-14B, it will be understood by those skilled in the art that the gate insulating layer 604 may also cover the entire surfaces of the Dirac material 603 and the material 602, or the insulating layer 604 may cover only the entire surface of the material 602 without covering the Dirac material 603. When the gate insulating layer 604 covers the Dirac material 603, the source 605 may be in contact with the Dirac material 603 through a via hole formed in the gate insulating layer 604. When the gate insulating layer 604 covers the entire surface of the material 602, the drain 607 may be in contact with the material 602 through a via hole formed in the gate insulating layer 604.

Figure 15A:
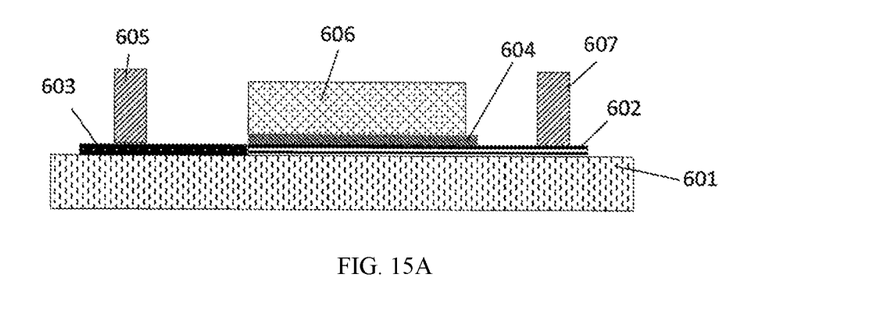
FIGS. 15A-15B exemplarily illustrate steps of forming a gate according to an embodiment of the present disclosure.
Figure 15B:
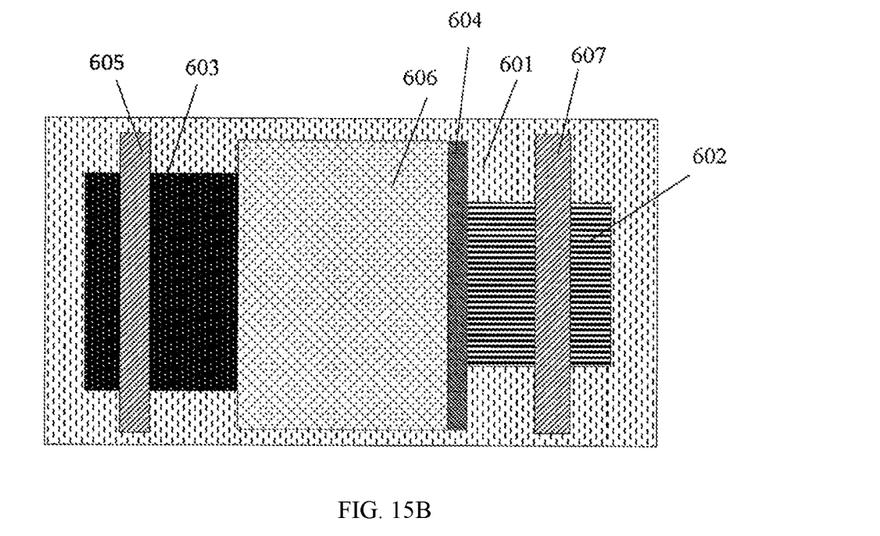

According to an embodiment of the present disclosure, the method may further include forming a gate. FIGS. 15A-15B exemplarily illustrate the steps of forming a gate 606. The gate 606 can be disposed on the gate insulating layer 604 and electrically insulated from the material 602 by the gate insulating layer 604. This step can be carried out, for example, by processes such as film growth, photolithography, etching and the like.

Those skilled in the art should understand that the above mentioned substrate 601, material 602, Dirac material 603, source 605, gate 606, and drain 607 are the same as substrate 101, material 102, Dirac material 103, source 105, gate 106, and drain 107 in FIG. 1 respectively, and thus description of them will not be repeatedly described herein.

Compared with related arts, a field effect transistor fabricated with the method according to an embodiment of the present disclosure can realize a subthreshold swing of less than 60 mV/Dec at room temperature, and can realize a smaller operating voltage, a similar on-state current and a smaller off-state current, reducing power consumption.

Those skilled in the art will appreciate that in some alternative embodiments, the steps shown in the flowcharts can be performed in a different order than shown in the Drawings. For example, two blocks shown in succession may in fact be executed substantially in parallel, or sometimes in a reverse order, depending on actual requirements.

Figure 16:
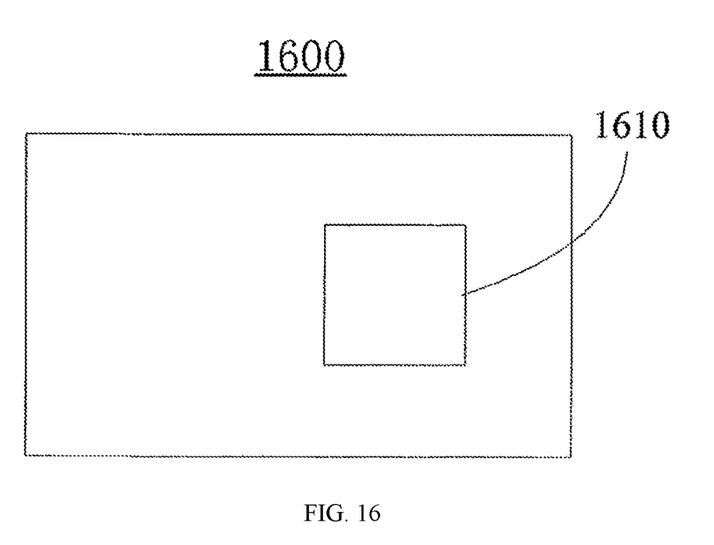
FIG. 16 shows a schematic block diagram of an electronic device according to an embodiment of the present disclosure.

FIG. 16 shows a schematic block diagram of an electronic device in accordance with an embodiment of the present disclosure. An electronic device 1600 may include a field effect transistor 1610 as described above with reference to FIG. 1 or FIG. 5. The electronic device 1600 can be, for example, an integrated circuit device, an electronic apparatus, a computer, or the like.

It should be understood by those skilled in the art that the present disclosure is not limited by the scope of the disclosure. Other variations or modifications may be made by those skilled in the art based on the disclosure above, and such changes or modifications are still within the scope of the present disclosure.

The invention claimed is:

1. A field effect transistor, comprising:
a source and a drain, the source being made of a Dirac material;
a channel disposed between the source and the drain, wherein the channel is made of a channel material; and
a gate disposed on the channel and electrically insulated from the channel;
wherein the channel material is a first material that is n-type doped and the Dirac material is a second material that is p-type doped, or the channel material is a first material that is p-type doped and the Dirac material is a second material that is n-type doped, and
wherein the first material when not being doped is different from the second material when not being doped.

2. The field effect transistor according to claim 1, wherein the Dirac material comprises: graphene, a Weyl semi-metal, a d-wave superconductor or a topological insulator.

3. The field effect transistor according to claim 1, wherein the source is in electrical contact with the channel.

4. The field effect transistor according to claim 3, wherein a contact barrier height between the source and the channel is less than 0.2 eV.

5. The field effect transistor according to claim 1, wherein
the source is n-doped and the channel is p-doped; or
the source is p-doped and the channel is n-doped.

6. The field effect transistor according to claim 1, further comprising:
a gate insulating layer formed on the channel and having an equivalent oxide thickness of less than 2 nm.

7. The field effect transistor according to claim 1, wherein the channel material comprises at least one of: a carbon nanotube, a semiconductor nanowire, a two-dimensional semiconductor material, and a three-dimensional semiconductor material.

8. The field effect transistor according to claim 1, wherein the drain and the channel are formed of the same layer of material.

9. The field effect transistor according to claim 1, wherein the drain is formed of the Dirac material or a metal material.

10. A method of fabricating a field effect transistor, comprising:
forming a channel on a substrate; and
forming a source and a drain on the substrate, such that the channel is disposed between the source and the drain, wherein the source is formed of a Dirac material and is doped opposite to the channel, the channel being made of a channel material;
wherein the channel material is a first material that is n-type doped and the Dirac material is a second material that is p-type doped, or the channel material is a first material that is p-type doped and the Dirac material is a second material that is n-type doped, and
wherein the first material when not being doped is different from the second material when not being doped.

11. The method of claim 10, wherein the Dirac material comprises: graphene, a Weyl semi-metal, ad-wave superconductor or a topological insulator.

12. The method of claim 10, wherein the step of forming a source and a drain on the substrate further comprises electrically contacting the source with the channel.

13. The method of claim 12, wherein a contact barrier height between the source and the channel is less than 0.2 eV.

14. The method according to claim 10, wherein
the source is n-doped and the channel is p-doped; or
the source is p-doped and the channel is n-doped.

15. The method according to claim 10, further comprising:
forming a gate insulating layer on the channel, wherein the gate insulating layer has an equivalent oxide thickness of less than 2 nm.

16. The method according to claim 10, wherein the drain and the channel are formed of the same layer of material.

17. The method according to claim 10, wherein the drain is formed of the Dirac material or a metal material.

18. The method according to claim 10, wherein the channel material comprises at least one of: a carbon nanotube, a semiconductor nanowire, a two-dimensional semiconductor material, and a three-dimensional semiconductor material.

19. An electronic device comprising the field effect transistor according to claim 1.

* * * * *